(12) United States Patent
Cheng et al.

(10) Patent No.: US 8,482,078 B2
(45) Date of Patent: Jul. 9, 2013

(54) INTEGRATED CIRCUIT DIODE

(75) Inventors: Kangguo Cheng, Schenectady, NY (US); Ali Khakifirooz, Mountain View, CA (US); Pranita Kulkarni, Slingerlands, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 13/104,542

(22) Filed: May 10, 2011

(65) Prior Publication Data
US 2012/0286364 A1 Nov. 15, 2012

(51) Int. Cl.
*H01L 21/70* (2006.01)

(52) U.S. Cl.
USPC ............ 257/369; 438/149; 438/199; 438/200

(58) Field of Classification Search
USPC .......................................... 257/369
See application file for complete search history.

(56) References Cited

U.S. PATENT DOCUMENTS

| | | | | |
|---|---|---|---|---|
| 5,221,850 A * | 6/1993 | Sakurai | ............. | 257/173 |
| 5,357,127 A * | 10/1994 | Park et al. | .............. | 257/189 |
| 5,516,717 A * | 5/1996 | Hsu | ................... | 438/275 |
| 5,557,117 A * | 9/1996 | Matsuoka et al. | .......... | 257/184 |
| 5,689,122 A * | 11/1997 | Chandrasekhar | ............ | 257/184 |
| 5,750,426 A * | 5/1998 | Rajkanan et al. | ............. | 438/210 |
| 5,780,333 A * | 7/1998 | Kim | ................. | 438/238 |
| 5,866,451 A * | 2/1999 | Yoo et al. | ................ | 438/241 |
| 5,952,701 A * | 9/1999 | Bulucea et al. | .............. | 257/407 |
| 6,030,872 A * | 2/2000 | Lu et al. | ................ | 438/283 |
| 6,096,584 A * | 8/2000 | Ellis-Monaghan et al. | .. | 438/151 |
| 6,110,772 A * | 8/2000 | Takada et al. | ................. | 438/238 |
| 6,174,803 B1 * | 1/2001 | Harvey | .................... | 438/638 |
| 6,177,306 B1 * | 1/2001 | Wu | ............... | 438/241 |
| 6,180,462 B1 * | 1/2001 | Hsu | ............... | 438/275 |

(Continued)

FOREIGN PATENT DOCUMENTS
EP     0621637 A1    10/1994

OTHER PUBLICATIONS

C. Menon et al., "Loading Effect in SiGe Layers Grown by Dichlorosilane-and Silane-Based Epitaxy," Journal of Applied Physics, vol. 90, No. 9, Nov. 1, 2001; pp. 4805-4809.

(Continued)

*Primary Examiner* — N Drew Richards
*Assistant Examiner* — Ankush Singal
(74) *Attorney, Agent, or Firm* — Cantor Colburn LLP; Vazken Alexanian

(57) ABSTRACT

A method includes forming isolation regions in a semiconductor substrate to define a first field effect transistor (FET) region, a second FET region, and a diode region, forming a first gate stack in the first FET region and a second gate stack in the second FET region, forming a layer of spacer material over the second FET region and the second gate stack, forming a first source region and a first drain region in the first FET region and a first diode layer in the diode region using a first epitaxial growth process, forming a hardmask layer over the first source region, the first drain region, the first gate stack and a portion of the first diode layer, and forming a second source region and a second drain region in the first FET region and a second diode layer on the first diode layer using a second epitaxial growth process.

14 Claims, 12 Drawing Sheets

U.S. PATENT DOCUMENTS

| | | | | |
|---|---|---|---|---|
| 6,204,105 B1* | 3/2001 | Jung | | 438/238 |
| 6,246,084 B1* | 6/2001 | Kim | | 257/296 |
| 6,294,834 B1* | 9/2001 | Yeh et al. | | 257/758 |
| 6,521,952 B1* | 2/2003 | Ker et al. | | 257/360 |
| 6,645,820 B1* | 11/2003 | Peng et al. | | 438/372 |
| 6,657,262 B2* | 12/2003 | Patti | | 257/370 |
| 6,797,554 B2* | 9/2004 | Katayama | | 438/210 |
| 6,908,826 B2* | 6/2005 | Kim | | 438/393 |
| 6,936,520 B2* | 8/2005 | Yamanoue et al. | | 438/383 |
| 6,936,895 B2* | 8/2005 | Manna et al. | | 257/355 |
| 7,122,449 B2 | 10/2006 | Langdo et al. | | |
| 7,129,545 B2* | 10/2006 | Cain et al. | | 257/355 |
| 7,138,313 B2 | 11/2006 | Chatty et al. | | |
| 7,256,142 B2 | 8/2007 | Fitzgerald | | |
| 7,439,591 B2* | 10/2008 | Kang | | 257/360 |
| 7,573,105 B2* | 8/2009 | Williams et al. | | 257/371 |
| 7,602,027 B2* | 10/2009 | Burke et al. | | 257/379 |
| 7,611,942 B2* | 11/2009 | Minami et al. | | 438/210 |
| 7,635,988 B2* | 12/2009 | Madurawe | | 326/40 |
| 7,692,212 B1* | 4/2010 | Rajavel et al. | | 257/184 |
| 7,795,681 B2* | 9/2010 | Williams et al. | | 257/349 |
| 7,811,875 B2* | 10/2010 | Anderson et al. | | 438/199 |
| 7,834,402 B2* | 11/2010 | Yoneda | | 257/369 |
| 7,855,422 B2* | 12/2010 | Hu et al. | | 257/379 |
| 7,868,388 B2* | 1/2011 | Petti | | 257/367 |
| 7,892,859 B2* | 2/2011 | Schwarzmann et al. | | 438/3 |
| 7,943,472 B2* | 5/2011 | Pendharkar et al. | | 438/379 |
| 8,138,570 B2* | 3/2012 | Williams et al. | | 257/500 |
| 8,138,579 B2* | 3/2012 | Liu et al. | | 257/635 |
| 2002/0033520 A1* | 3/2002 | Kunikiyo | | 257/577 |
| 2002/0056869 A1* | 5/2002 | Morimoto | | 257/313 |
| 2002/0139971 A1* | 10/2002 | Eda | | 257/22 |
| 2004/0248359 A1* | 12/2004 | Hieda | | 438/239 |
| 2005/0014329 A1* | 1/2005 | Williams et al. | | 438/218 |
| 2005/0064658 A1* | 3/2005 | Biery et al. | | 438/239 |
| 2005/0098832 A1* | 5/2005 | Yoshida | | 257/368 |
| 2005/0110070 A1* | 5/2005 | Omura | | 257/311 |
| 2005/0139887 A1* | 6/2005 | Song | | 257/296 |
| 2005/0158939 A1* | 7/2005 | Williams et al. | | 438/199 |
| 2006/0223258 A1* | 10/2006 | Okushima | | 438/202 |
| 2006/0228850 A1 | 10/2006 | Tsai et al. | | |
| 2006/0263951 A1* | 11/2006 | Seo et al. | | 438/149 |
| 2007/0090417 A1* | 4/2007 | Kudo | | 257/288 |
| 2007/0187795 A1* | 8/2007 | Langguth et al. | | 257/458 |
| 2007/0267705 A1* | 11/2007 | Won et al. | | 257/379 |
| 2008/0179685 A1* | 7/2008 | Petti | | 257/369 |
| 2009/0001469 A1* | 1/2009 | Yoshida et al. | | 257/347 |
| 2009/0078963 A1* | 3/2009 | Khodja | | 257/189 |
| 2009/0085163 A1* | 4/2009 | Russ et al. | | 257/594 |
| 2009/0101988 A1* | 4/2009 | Kohli | | 257/378 |
| 2009/0115023 A1* | 5/2009 | Kim | | 257/532 |
| 2009/0209057 A1* | 8/2009 | Langguth et al. | | 438/72 |
| 2009/0256129 A1* | 10/2009 | Scheuerlein | | 257/4 |
| 2010/0019343 A1* | 1/2010 | Ellis et al. | | 257/500 |
| 2010/0127259 A1* | 5/2010 | Nozu | | 257/49 |
| 2010/0289075 A1 | 11/2010 | Lin et al. | | |

OTHER PUBLICATIONS

J. Hallstedt et al., "Pattern Dependency in Selective Epitaxy of B-Doped SiGe Layers for Advanced Metal Oxide Semiconductor Field Effect Transistors," Journal of Applied Physics (2008) 103, 054907, pp. 1-6; copyright 2008 American Institute of Physics; published online Mar. 11, 2008.

J.M. Hartmann et al., "Selective Epitaxial Growth of Si and SiGe for Metal Oxide Semiconductor Transistors," Journal of Crystal Growth 259 (2003); pp. 419-427; accepted Jul. 24, 2003; Copyright 2003 Elsevier B.V. All rights reserved.

T. Uchino et al., "A Raised Source/Drain Technology Using In-Situ P-Doped SiGe and B-doped Si for 0.1-um CMOS ULSIs," Copyright 1997 IEEE, IEDM 97 pp. 480-482.

* cited by examiner

INTEGRATED CIRCUIT DIODE

FIELD

The present invention relates generally to integrated circuits, and more specifically, to fabricating diodes and resultant diode structures in integrated circuits.

DESCRIPTION OF RELATED ART

Diodes may be formed on semiconductor substrates that may include other devices such as field effect transistors (FETs). Previous diodes were fabricated by implanting dopants or ions in relatively thick semiconductor layers to improve the characteristics of the diodes. These types of diodes often exhibited undesirably high leakage currents due to defects in the implants. As the thickness of the semiconductor layers in FET devices continues to be reduced, the use of a relatively thick semiconductor layer for diodes continues to be problematic.

SUMMARY

According to one embodiment of the present invention, a method includes forming a isolation regions in a silicon substrate to define an first field effect transistor (FET) region, a second FET region, and a diode region, forming a first gate stack in the first FET region and a second gate stack in the second FET region, forming a layer of spacer material over the second FET region and the second gate stack, forming a first source region and a first drain region in the first FET region and a first diode layer in the diode region using a first epitaxial growth process, forming a hardmask layer over the first source region, the first drain region, the first gate stack and a portion of the first diode layer, and forming a second source region and a second drain region in the first FET region and a second diode layer on the first diode layer using a second epitaxial growth process.

According to another embodiment of the present invention, a method includes forming a isolation regions in a silicon substrate to define an first field effect transistor (FET) region and a diode region, forming a first gate stack in the first FET region, forming a first source region and a first drain region in the first FET region and a first diode layer in the diode region using a first epitaxial growth process, forming a hardmask layer over the first source region, the first drain region, the first gate stack and a portion of the first diode layer, and forming a second diode layer on the first diode layer using a second epitaxial growth process.

According to yet another embodiment of the present invention, a semiconductor device includes a first FET disposed on a substrate having a source region and a drain region, the source region and the drain region of the first FET including a first epitaxial material, a diode disposed on the substrate having a first layer disposed on the substrate, an insulator layer disposed on the first layer, and a third layer disposed on the insulator layer, the first layer including the first epitaxial material, the insulator layer including an undoped epitaxial material, and the third layer including a second epitaxial material.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Diodes are often fabricated in semiconductor devices by implanting dopants or ions in a layer of the semiconductor substrate. The layer of semiconductor substrate is often relatively thick to improve the electrical characteristics of the diodes. However, a thick semiconductor substrate layer may be undesirable when fabricating FET devices on the semiconductor substrate. The methods and resultant structures described below offer a process for forming a diode and FET devices on a semiconductor substrate layer with a relatively thin thickness using epitaxial material growth processes.

Figure 1:
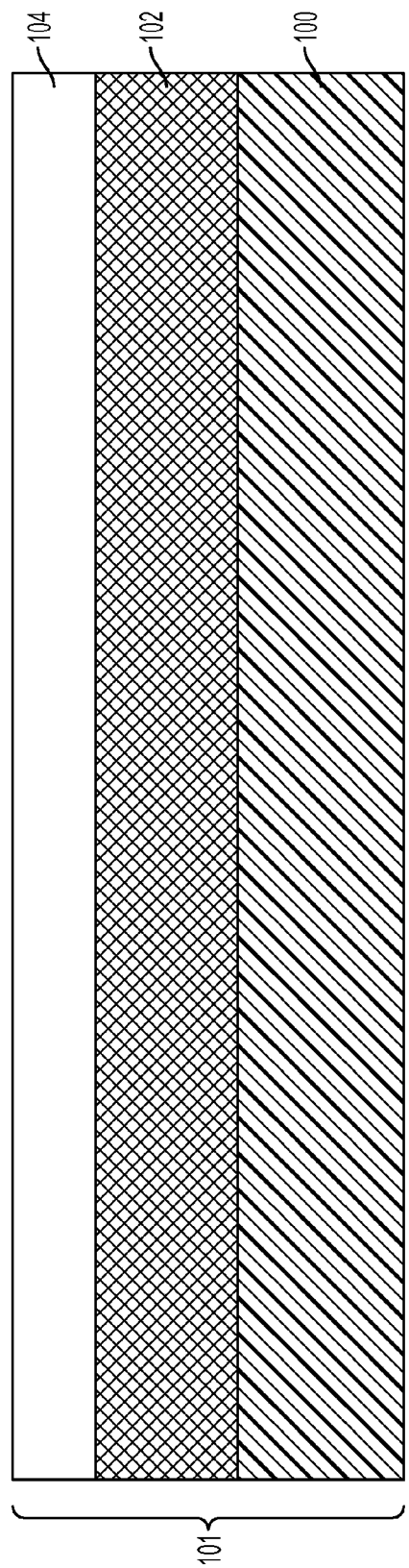
FIG. 1 illustrates a side cut-away view of a semiconductor substrate arrangement.

FIGS. 1-11 illustrate an exemplary method and resultant structure for forming a diode and FET devices on a silicon substrate. In this regard, FIG. 1 illustrates a side cut-away view of a semiconductor substrate arrangement 101 that includes a bulk substrate layer 100, a buried insulating layer (e.g., buried oxide (BOX)) layer 102 disposed on the substrate layer 100, and a semiconductor on insulator (SOI) layer 104 disposed on the BOX layer 102. The SOI layer 104 may comprise any semiconducting material including, but not limited to Si, strained Si, SiC, SiGe, SiGeC, Si alloys, Ge, Ge alloys, GaAs, InAs, and InP, or any combination thereof. The SOI layer 104 may be thinned to a desired thickness by planarization, grinding, wet etch, dry etch, oxidation followed by oxide etch, or any combination thereof. One method of thinning the SOI layer 104 is to oxidize the silicon by a thermal dry or wet oxidation process, and then wet etch the oxide layer using a hydrofluoric acid mixture. This process can be repeated to achieve the desired thickness. In one embodiment, the SOI layer 104 may be extremely thin SOI (ETSOI) with a thickness ranging from 1.0 nm to 10.0 nm. In another embodiment, the SOI layer 104 has a thickness ranging from 1.0 nm to 5.0 nm. In a further embodiment, the SOI layer 104 has a thickness ranging from 3.0 nm to 8.0 nm. The substrate layer 100 may be a semiconducting material including, but not limited to Si, strained Si, SiC, SiGe, SiGeC, Si alloys, Ge, Ge alloys, GaAs, InAs, InP as well as other III/V and II/VI compound semiconductors.

The insulating layer 102 that may be present underlying the SOI layer 104 and atop the substrate layer 100 may be formed by implanting a high-energy dopant into the substrate 100 and then annealing the structure to form a buried insulating layer, i.e., the insulating layer 102. In another embodiment, the insulating layer 102 may be deposited or grown prior to the formation of the SOI layer 104. In yet another embodiment, the substrate 5 may be formed using wafer-bonding techniques, where a bonded wafer pair is formed utilizing glue, adhesive polymer, or direct bonding. The insulating layer 102 may include a single or multiple layers of insulating materials such as oxide, nitride, oxynitride, high-k dielectric, etc.

Figure 2:
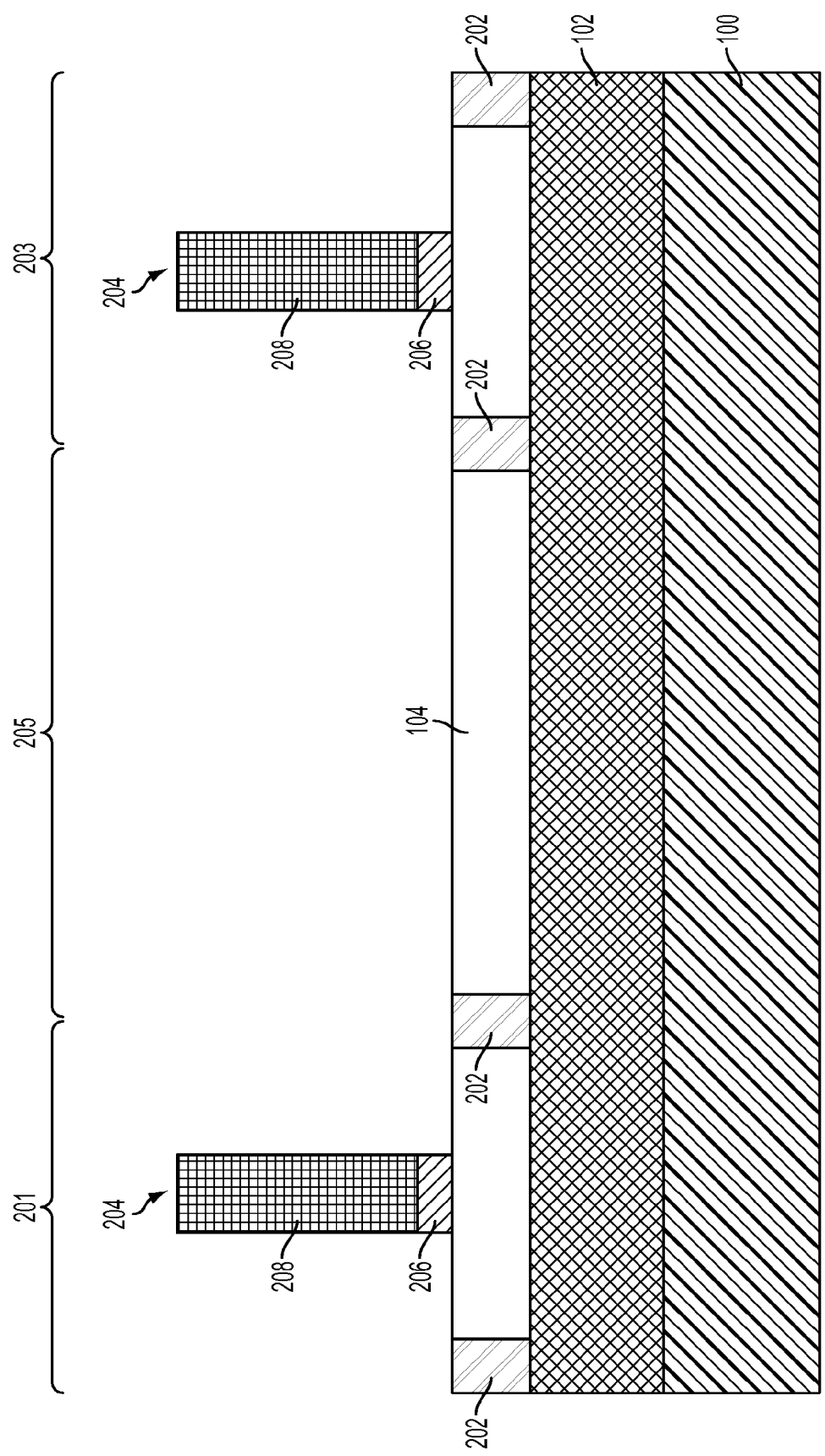
FIG. 2 illustrates the resultant structure following the formation of isolation regions in the substrate of FIG. 1.

FIG. 2 illustrates the resultant structure following the formation of isolation regions 202 in the SOI layer 104. The isolation regions 202 may be defined by, for example, a lithographic patterning and etching process that removes portions of the SOI layer 104, down to the top of the BOX layer 102 to define the isolation regions 202. The isolation regions 202 may be formed by, for example, depositing a dielectric material such as a silicon oxide or an oxynitride material in the defined isolation regions 202. A liner material (not shown) such as, for example, a high-K dielectric, oxide, or nitride material may be formed prior to depositing the dielectric material. The isolation regions 202 partially define an n-type FET (nFET) region 201, a p-type FET (pFET) region 203, and a diode region 205 in the SOI layer 104. In the illustrated embodiment, gate stacks 204 have been formed in the nFET region 201 and the pFET region 203. The gate stacks 204 may include any number of layers of gate material such as a gate dielectric material 206 and gate conductor material layer 208 and a capping layer that may include, for example, a polysilicon material. The gate stacks 204 may be formed using any appropriate methods that may include, for example, any variety of photolithographic patterning, material etching, and material deposition methods.

Though the illustrated embodiment includes gate stacks 204 that may be used to form FET devices, in alternate embodiments, the gate stacks 204 may be formed from a material such as, for example, polysilicon to form dummy gate stacks having a similar size and shape as the gate stacks 204. Dummy gate stacks may be used to define a channel region in the SOI layer 104. In exemplary fabrication methods, the dummy gate stacks may be formed to define the channel region and allow subsequent fabrication processes to be performed. Once the subsequent fabrication processes have been performed, the dummy gate stacks may be removed and replaced with the gate stacks 204 that are used in the FET devices. For illustrative purposes, the illustrated embodiments include gate stacks 204. However, alternate embodiments may include the formation of dummy gate stacks instead of the illustrated gate stacks 204 that may be subsequently removed and replaced with gate stacks similar to the gate stacks 204 in follow on processes.

Figure 3:
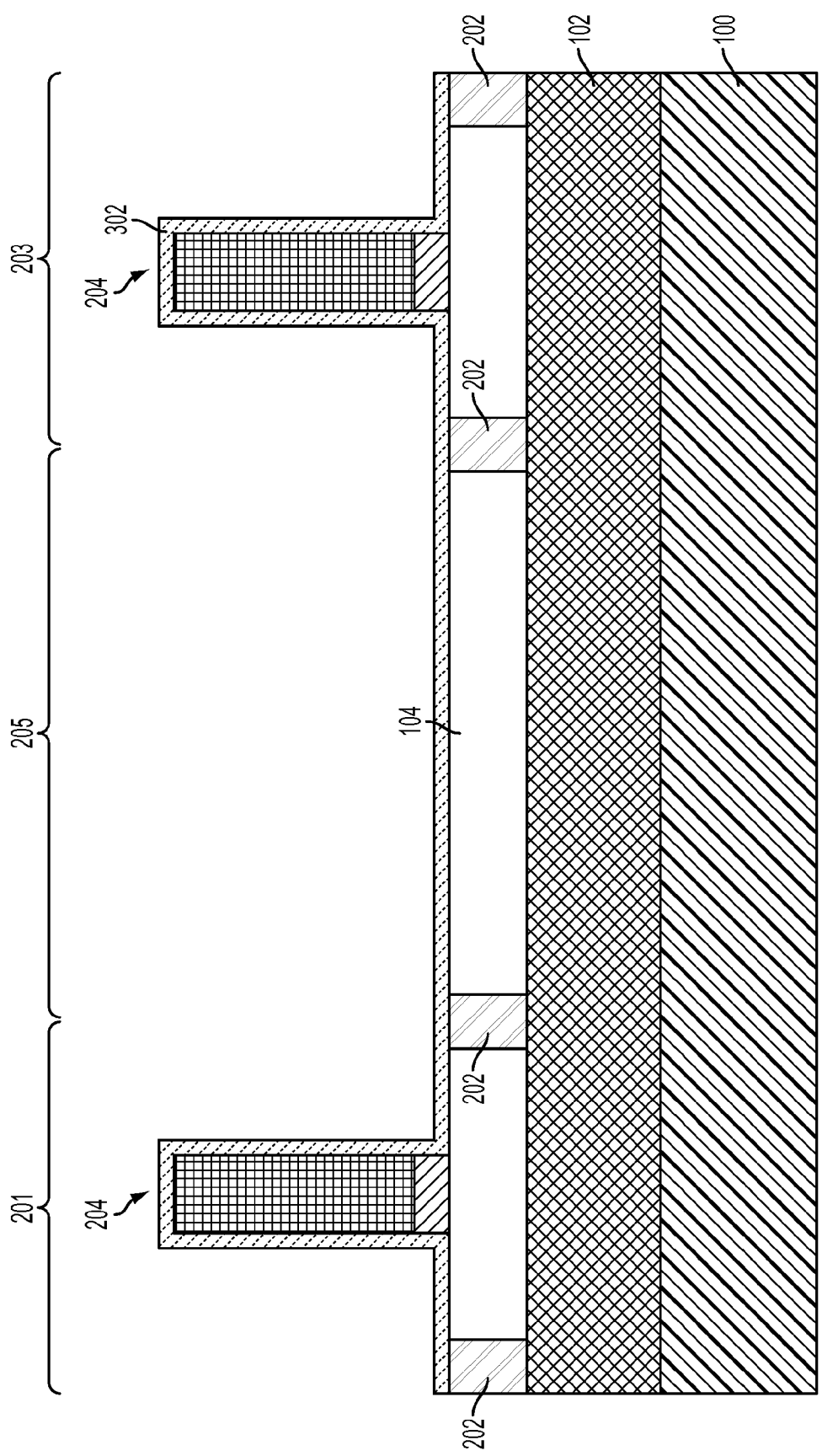
FIG. 3 illustrates the resultant structure following the deposition of a spacer material layer.

FIG. 3 illustrates the resultant structure following the deposition of a spacer material layer 302 over the exposed portions of the isolation regions 202, the SOI layer 104, and the gate stacks 204. The spacer material layer 302 may include, for example, a nitride material or an oxide material.

Figure 4:
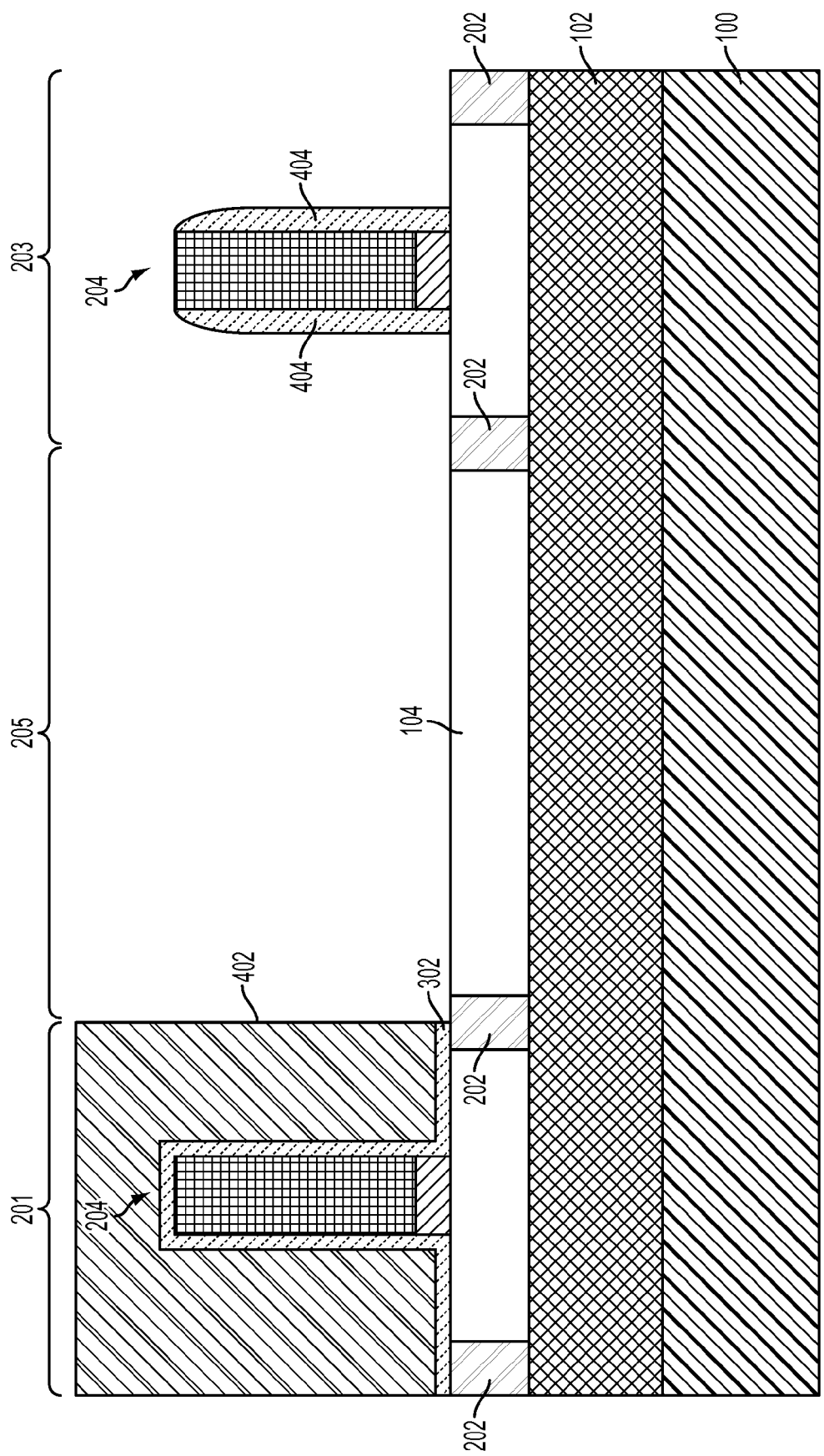
FIG. 4 illustrates the resultant structure following the removal of portions of the spacer material layer.

FIG. 4 illustrates the resultant structure following the removal of portions of the spacer material layer 302. In this regard, a masking material 402 has been deposited and patterned over the spacer material layer 302 in the nFET region 201. An etching process such as, for example, anisotropic etching process (e.g., reactive ion etch (RIE)) has been performed to remove exposed portions of the spacer material layer 302. The anisotropic etching process may form the spacers 404 along side walls of the gate stack 204 in the pFET region 203.

Figure 5:
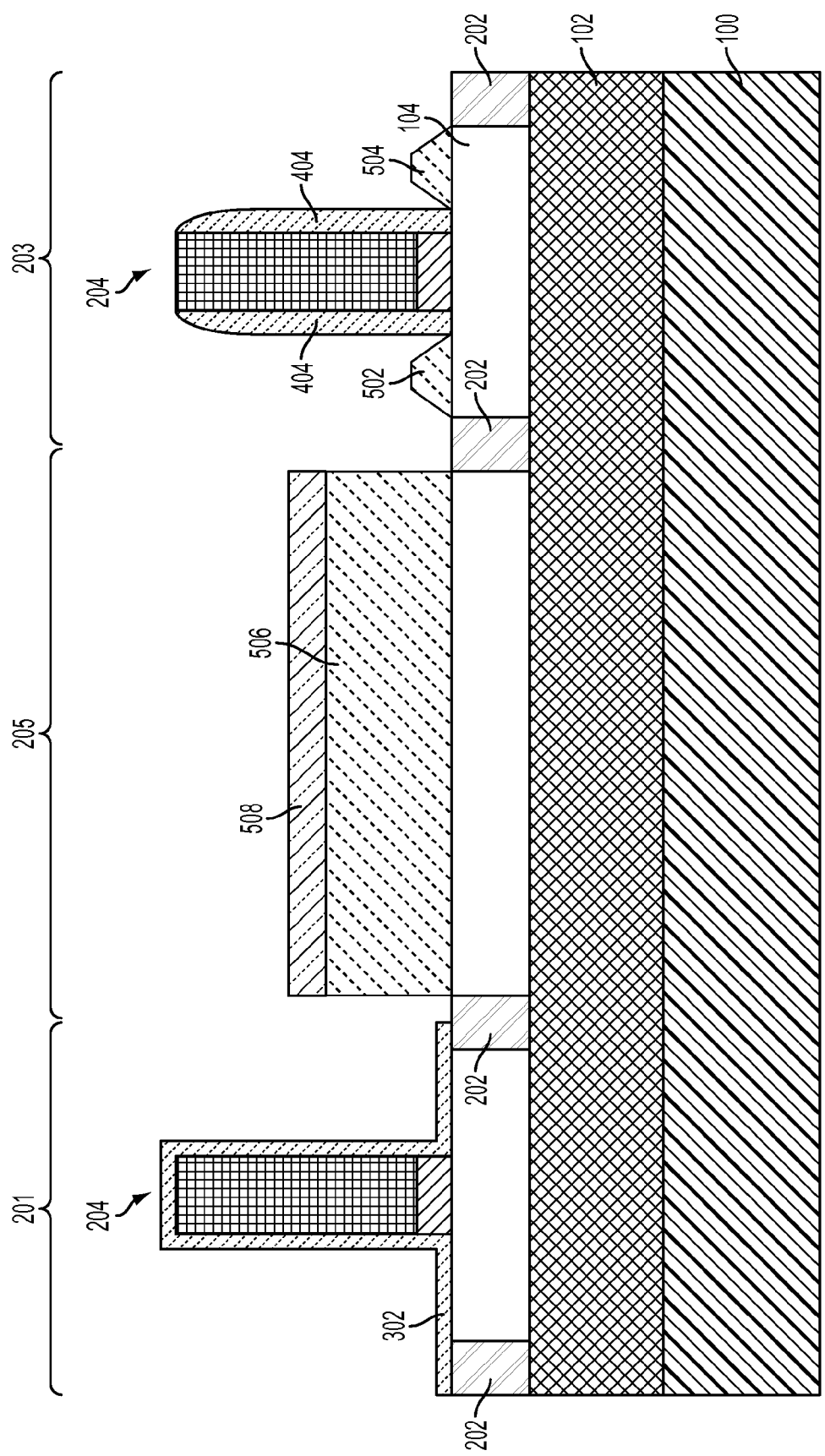
FIG. 5 illustrates the formation of a source region, a drain region, and a diode layer.

FIG. 5 illustrates the formation of a raised source region 502 and a raised drain region 504 in the pFET region 203, as well as a first doped diode layer 506 in the diode region 205. In this regard, the masking material 402 (of FIG. 4) has been removed. The source and drain regions 502 and 504 and the first doped diode layer 506 are formed using an epitaxial growth process that forms a silicon material such as, for example, SiGe or Si on exposed portions of the SOI layer 104. The Si material is doped with p-type ions such as, for example, boron (B) or aluminum (Al) during the epitaxial growth process (i.e., in situ doped) such that the resultant source and drain regions 502 and diode layer 506 include p-type ions. The loading effect of the epitaxial growth process results in a thicker growth of epitaxy material in the larger exposed region of the SOI layer 104 (the diode region 205) as opposed to the smaller exposed regions of the SOI layer 104 (the pFET region 203). Thus, the first doped diode layer 506 is thicker than the source and drain regions 502 and 504. In the illustrated embodiment, an undoped layer of silicon material (e.g., Si or SiGe) has been formed on the diode layer 506 to define an undoped diode layer 508. The undoped diode layer 508 may be formed, for example, during the epitaxial growth process after ambient dopants in the epitaxial chamber have been consumed in the formation of the source and drain regions 502 and 504 and the first doped diode layer 506. The continuation of the epitaxial growth process without ambient dopants forms the undoped diode layer 508. In some embodiments, a thin undoped layer of Si material (not shown) may form on the source and drain regions 502 and 504 in the epitaxial growth process. An undoped silicon formation on the source and drain regions 502 and 504 may be consumed during a subsequent salicidation process that will be explained in further detail below.

Figure 6:
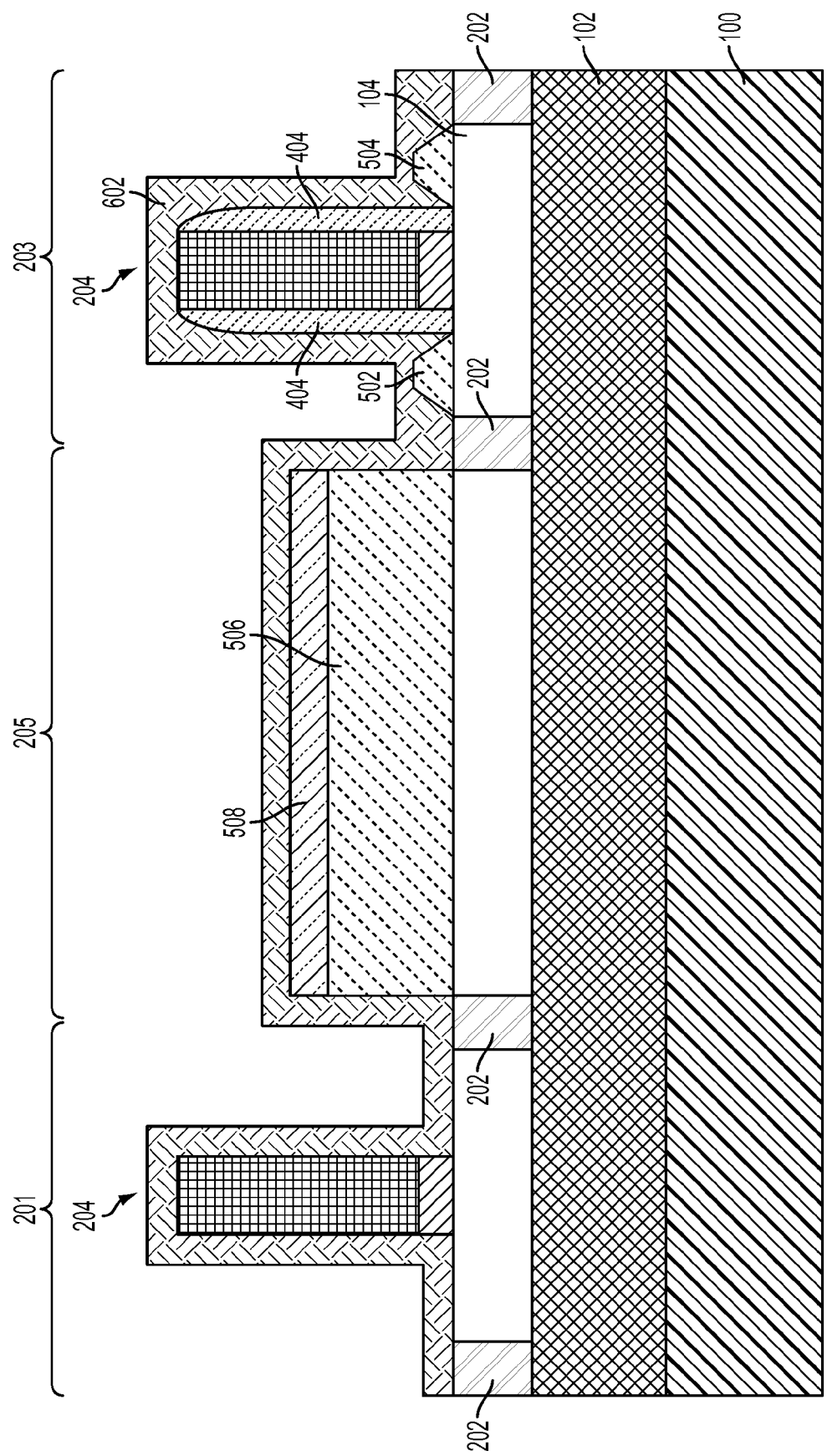
FIG. 6 illustrates the formation of a hardmask layer.

FIG. 6 illustrates the formation of a hardmask layer 602 that may include, for example, a nitride or oxide material. In the illustrated embodiment, the spacer material layer 302 (of FIG. 3) has been removed with a selective etching process prior to the formation of the hardmask layer 602 such that the hardmask layer 602 is formed over the exposed portions of the SOI layer 104 in the nFET region 201, the isolation regions 202, the undoped diode layer 508, the source and drain regions 502 and 504, and the gate stacks 204. In an alternate exemplary method, the spacer material layer 302 may be left in place, and the spacer material layer the hardmask layer 602 may be formed over the spacer material layer 302 as well.

Figure 7:
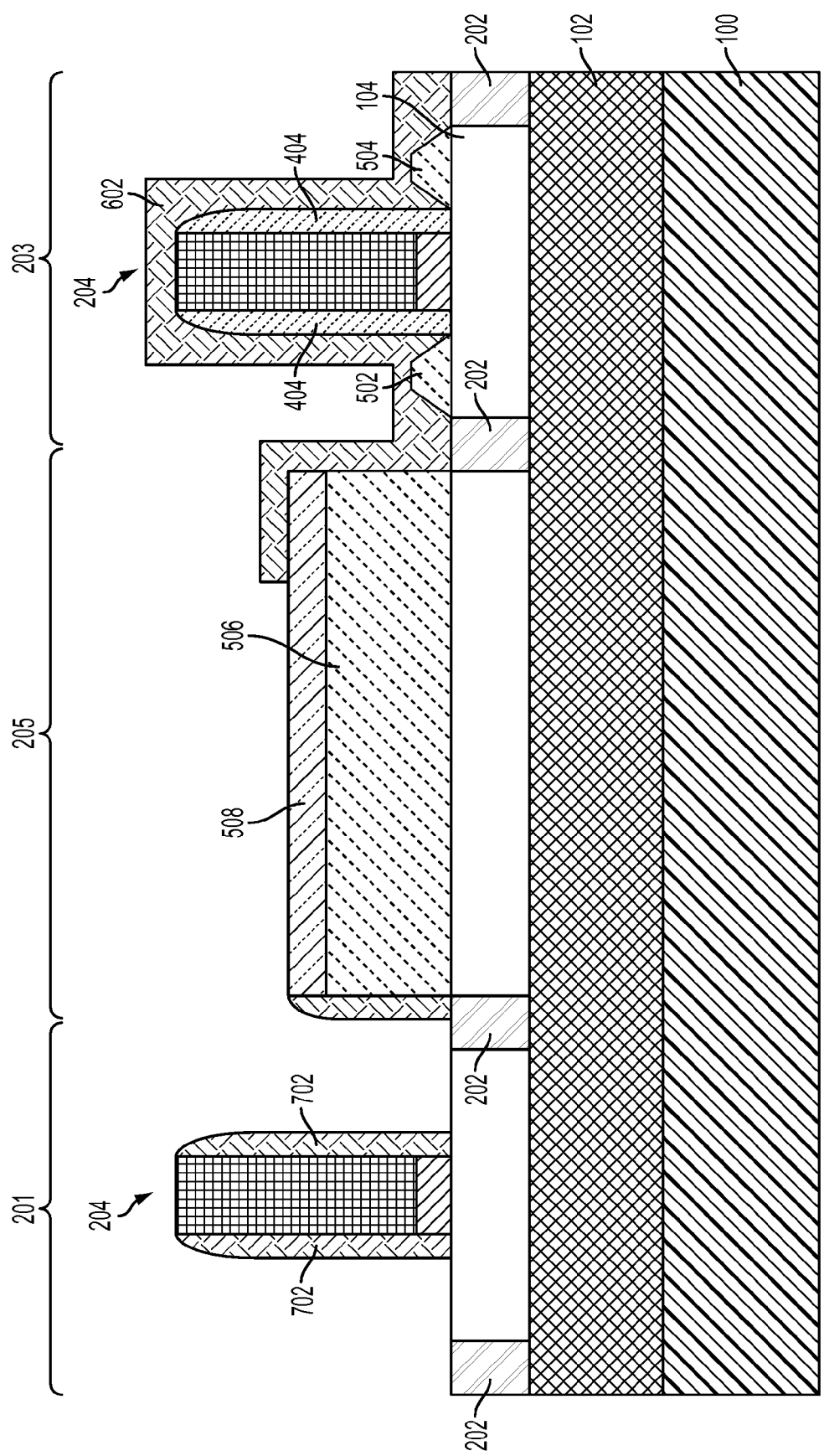
FIG. 7 illustrates the resultant structure following the removal of portions of the hardmask layer.

FIG. 7 illustrates the resultant structure following the removal of portions of the hardmask layer 602. In this regard, portions of the hardmask layer 602 in the pFET region 203 and portions of the diode region 205 may be protected by, for example, a photolithographic masking material. The exposed portions of the hardmask layer 602 may be removed using, for example, an anisotropic etching process (e.g., RIE) to expose portions of the SOI layer in the nFET region 201 and portions of the undoped diode layer 508. The anisotropic etching process may result in the formations of spacers 702 along sidewalls of the gate stack 204 in the nFET region 201. As discussed above, in an alternate embodiment, the hardmask layer 602 may be formed over portions of the spacer material layer 302 in the nFET region 201. In such an embodiment, following the removal of portions of the hardmask layer 602, the exposed portions of the spacer material layer 302 in the nFET region 201 may be removed using a subsequent etching process to expose portions of the SOI layer 104 in the nFET region 201.

Figure 8:
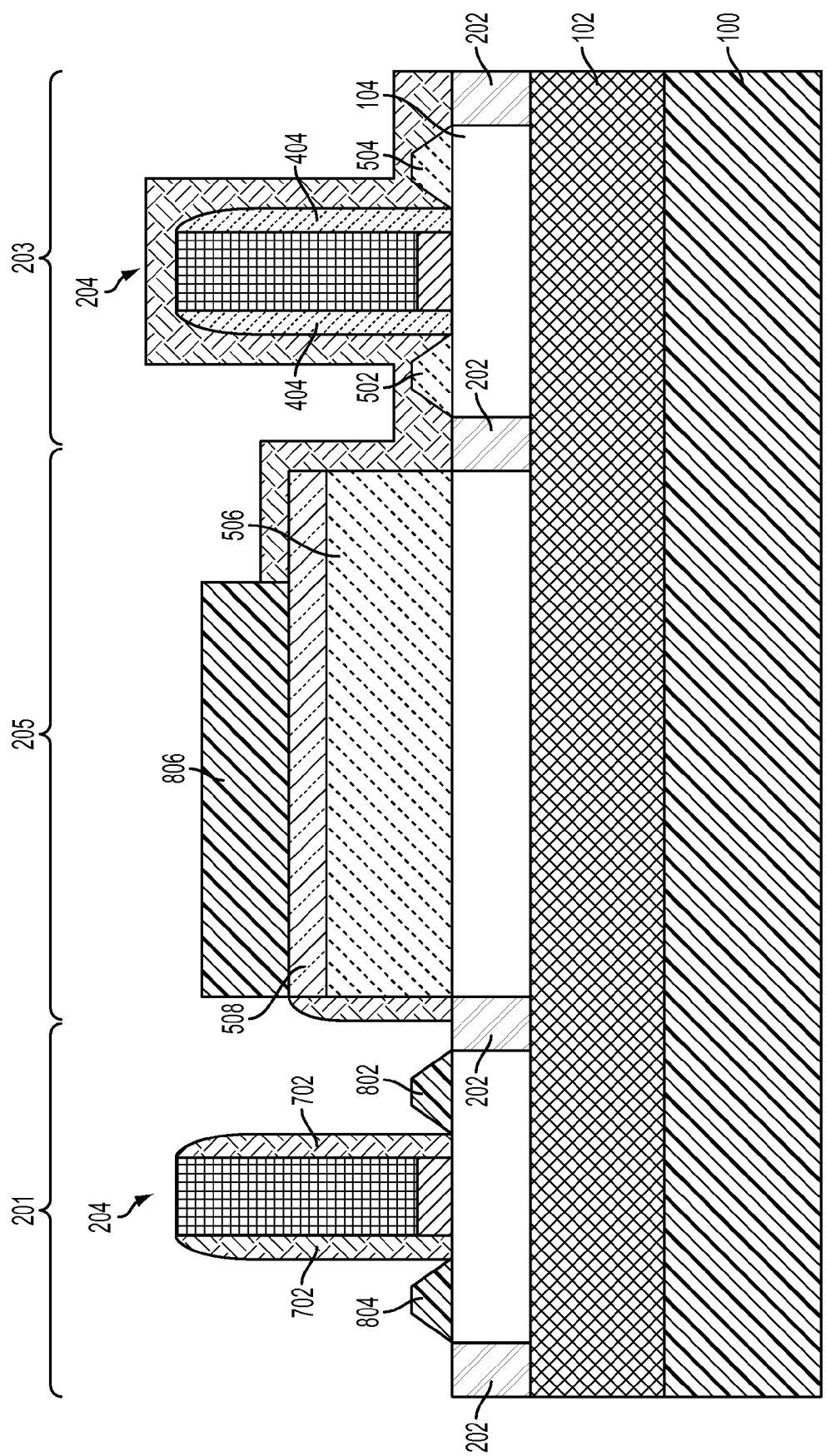
FIG. 8 illustrates the formation of a source region, a drain region, and a diode layer.

FIG. 8 illustrates the formation of a raised source region 802 and a raised drain region 804 in the nFET region 201, as well as a second doped diode layer 806 in the diode region 205. The source and drain regions 802 and 804 and the second doped diode layer 806 are formed using an epitaxial growth process similar to the epitaxial growth process used to form the source and drain regions 502 and 504 and the first doped diode layer 506 described above. However, the source and drain regions 802 and 804 and the second doped diode layer 806 may be formed from, for example, epitaxially grown Si or SiC, and are in situ-doped with an n-type dopant such as, for example, phosphorus (P) or arsenic (As). The loading effect of the epitaxial growth process results in a diode layer 805 that has a greater thickness than the source and drain regions 802 and 804.

Figure 9:
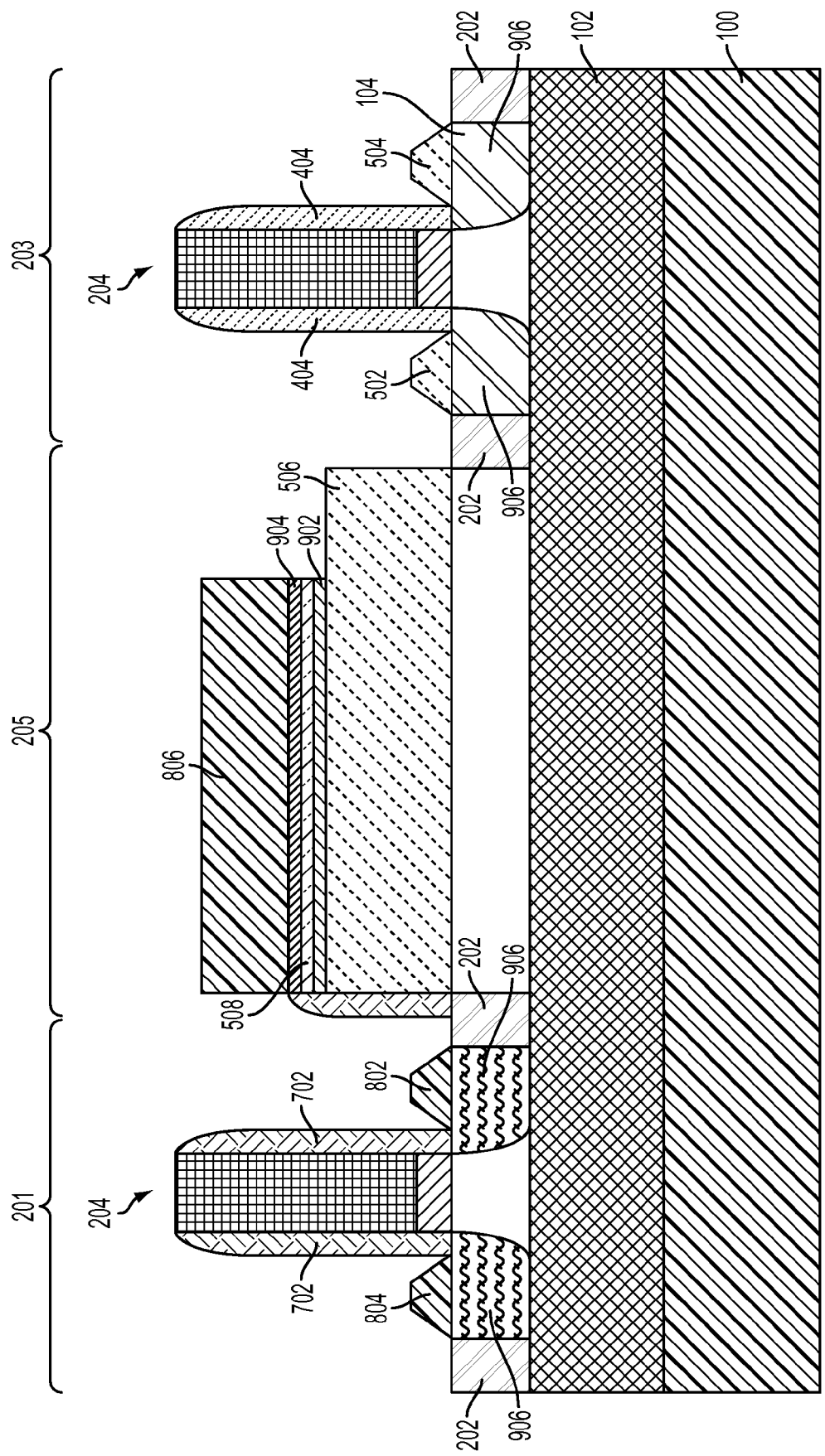
FIG. 9 illustrates the resultant structure following the removal of portions of the hardmask layer.

FIG. 9 illustrates the resultant structure following the removal of portions of the hardmask layer 602 using, for example, an isotropic etching process. A lithographic masking and etching process may be used to remove exposed portions of the undoped diode layer 508 to expose portions of the first doped diode layer 506. An annealing process may be performed that forms source and drain extension regions 906 in the SOI layer 104. The annealing process may form a lightly n-type doped region 904 and a lightly doped p-type region 902 in the undoped diode layer 508 by driving n-type diode layer 806 and p-type ions from the first doped diode layer 506 into adjacent portions of the undoped diode layer 508. A self-aligned silicidation (salicidation) process may be performed to form a silicide material (not shown) over exposed portions of the source and drain regions 502, 504, 802, and 804; and the first and second doped diode layers 506 and 806.

Figure 10:
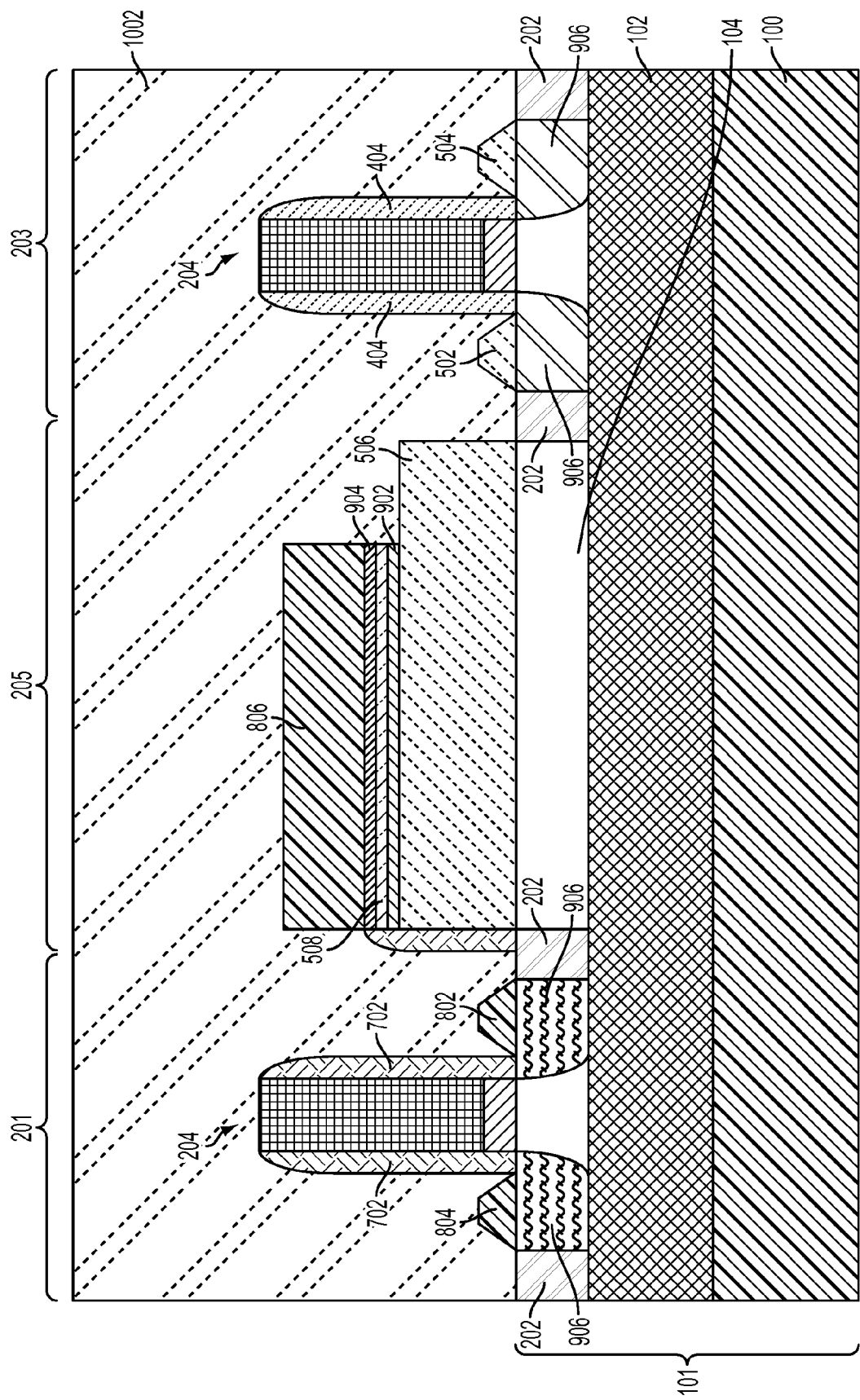
FIG. 10 illustrates the formation of a capping layer.

FIG. 10 illustrates the formation of a capping layer 1002 that may include, for example, an oxide material over the exposed features in the nFET region 201, the diode region 205, and the pFET region 203.

Figure 11:
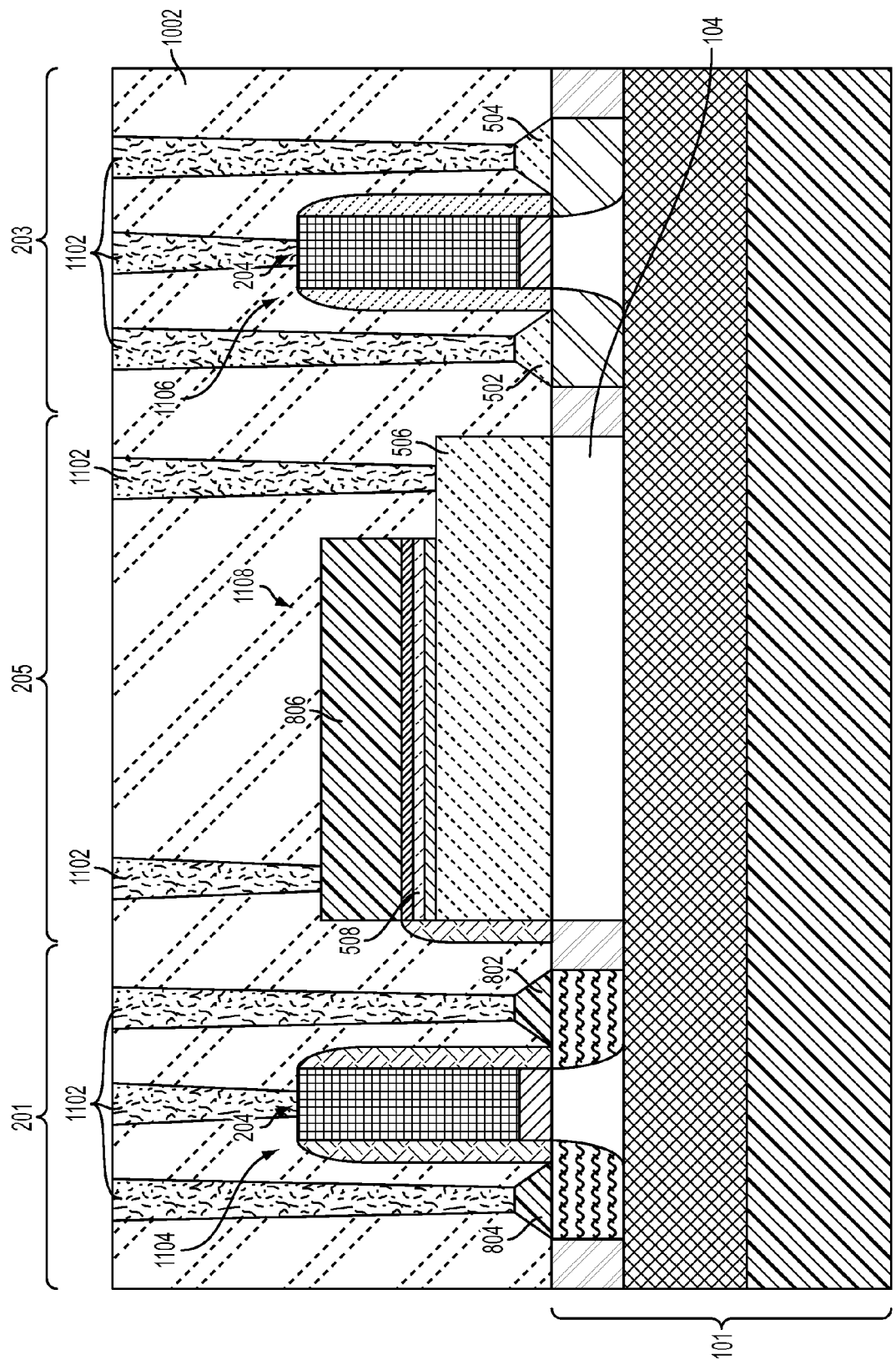
FIG. 11 illustrates an exemplary embodiment of the resultant structure of FET and diode devices following the formation of conductive vias in the capping layer.

FIG. 11 illustrates an exemplary embodiment of the resultant structure following the formation of conductive vias 1102 in the capping layer 1002. The vias 1102 may be formed by, for example, a lithographic patterning and etching process that forms cavities in the capping layer 1002 that expose portions of the source and drain regions 502, 504, 802, and 804; the gate stacks 204; and the first and second doped diode layers 506 and 806. A salicidation process may be performed to form a silicide material (not shown) in the exposed regions if, for example, the silicide material has not been formed in a previous process. The cavities in the capping layer 1002 may be filled with a conductive material such as, for example, tungsten (W) and/or copper (Cu) to form the vias 1102.

The resultant structure includes an nFET device 1104 formed on the SOI layer 104 in the nFET region 201, a pFET device 1106 formed on the SOI layer 104 in the pFET region 203 and a PIN (p-type-intrinsic (undoped)-n-type) diode device 1108 formed on the SOI layer 104 in the diode region 205. The PIN diode device 1108 includes a p-type layer (the first doped diode layer 506) formed on the SOI layer 104, an intrinsic layer (the undoped diode layer 508) formed on the diode layer 506, and an n-type layer (the second doped diode layer 806) formed on the undoped diode layer 508.

Figure 12:
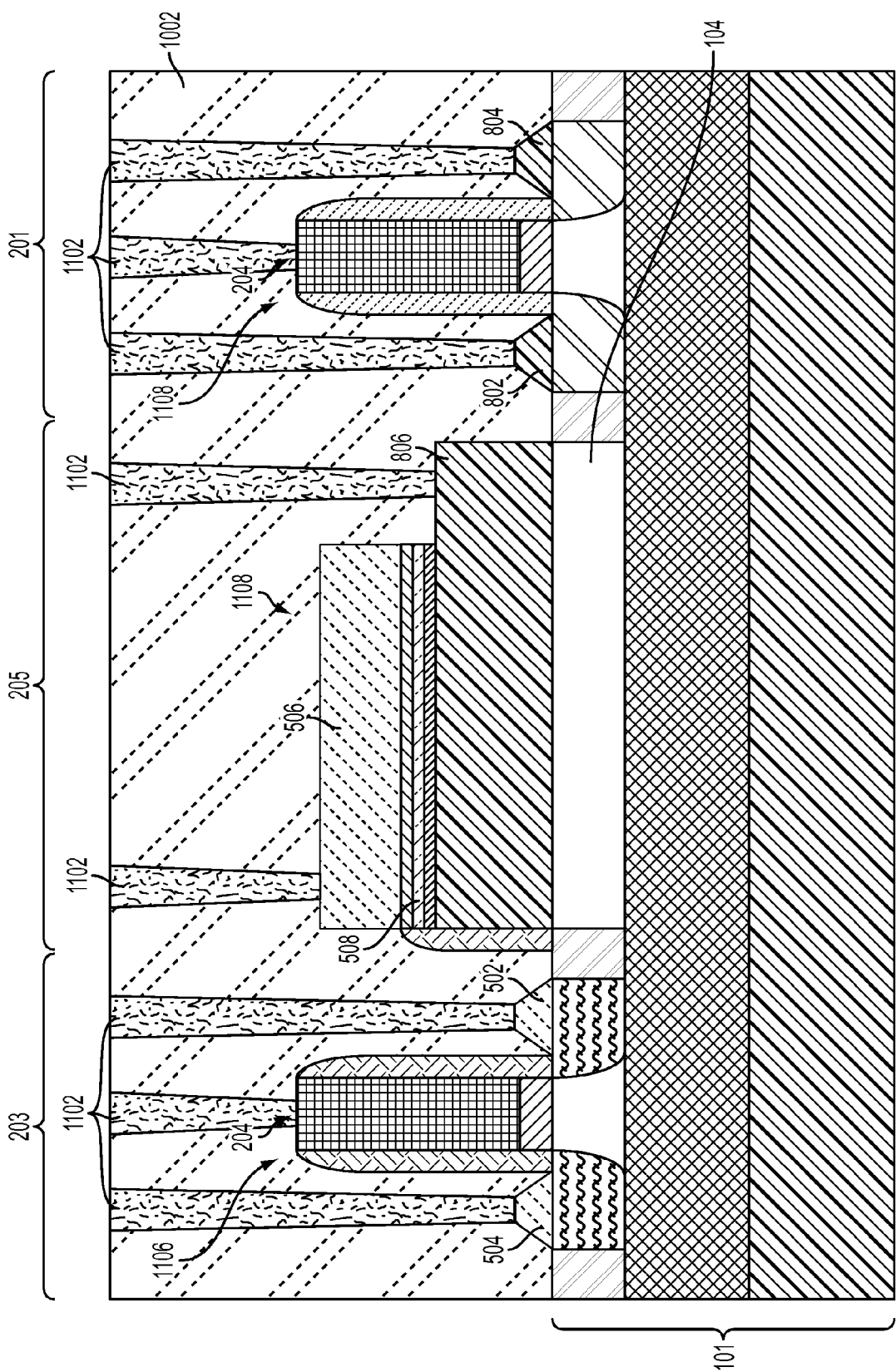
FIG. 12 illustrates an alternate exemplary embodiment of an arrangement of FET and diode devices.

The illustrated exemplary methods include forming the p-type doped source and drain regions 502 and 504 (of the pFET device 1106) and the p-type doped diode layer 506 prior to forming the n-type doped source and drain regions 802 and 804 (of the nFET device 1106) and the n-type doped diode layer 806. Alternate embodiments may include, for example, forming the n-type doped source and drain regions 802 and 804 and the n-type doped diode layer 806 prior to forming the p-type doped source and drain regions 502 and 504 (of the pFET device 1106) and the p-type doped diode layer 506. In such alternate exemplary embodiments, similar processes described above would be used. FIG. 12 illustrates an alternate exemplary embodiment of an arrangement similar to the arrangement described above in FIG. 11, however the resultant structure includes an n-type diode layer 806 disposed on the SOI layer 104, an undoped layer 508 formed on the n-type diode layer 806 and a p-type diode layer 506 formed on the undoped layer 508. Alternatively, the layer 508 may be lightly doped due to the dopant diffusion from the doped layers 806 and 506.

As discussed above, alternate embodiments may include the formation of dummy gate stacks having a similar size, shape, and location as the gate stacks 204 as opposed to forming the gate stacks 204 as shown. In such alternate embodiments, the dummy gate stacks (not shown) would be removed prior to or after the annealing process and replaced with actual gate stacks similar to the gate stacks 204. In this regard, a masking process may, for example, be used to protect the source and drain regions 502, 504, 802, and 804, and the layers in the diode region 205. The dummy gate stacks may then be removed and replaced with the gate stacks 204 using any variety of photolithographic patterning, etching, and deposition processes.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method, comprising:
    forming isolation regions in a semiconductor substrate to define a first field effect transistor (FET) region, a second FET region, and a diode region;
    forming a first gate stack in the first FET region and a second gate stack in the second FET region;
    forming a layer of spacer material over the second FET region and the second gate stack;
    forming a first source region and a first drain region in the first FET region and a first diode layer in the diode region using a first epitaxial growth process;
    forming a hardmask layer over the first source region, the first drain region, the first gate stack and a portion of the first diode layer; and
    forming a second source region and a second drain region in the first FET region and a second diode layer on the first diode layer using a second epitaxial growth process.

2. The method of claim 1, wherein the first epitaxial growth process includes epitaxially growing a silicon material with p-type dopants such that the first source region, the first drain region, and portions of the first diode layer include p-type dopants, and the second epitaxial growth process includes epitaxially growing a silicon material with n-type dopants such that the second source region, the second drain region, and the second diode layer include n-type dopants.

3. The method of claim 1, wherein the first epitaxial growth process includes epitaxially growing a silicon material with n-type dopants such that the first source region, the first drain region, and portions of the first diode layer include n-type dopants, and the second epitaxial growth process includes epitaxially growing a silicon material with p-type dopants such that the second source region, the second drain region, and the second diode layer include p-type dopants.

4. The method of claim 1, wherein the first diode layer has a greater thickness than the first source region.

5. The method of claim 1, wherein the second epitaxial growth process includes epitaxially growing silicon germanium material.

6. The method of claim 1, wherein the forming a layer of spacer material over the second FET region and the second gate stack includes:
    depositing a spacer material over the exposed portions of the isolation regions, the first FET region, the second FET region, the diode region, the first gate stack and the second gate stack;
    forming a lithographic masking material over the spacer material in the second FET region and the second gate stack;
    etching to remove exposed portions of the layer of spacer material; and
    removing the lithographic masking material.

7. The method of claim 1, wherein the etching to remove exposed portions of the layer of spacer material includes an isotropic etching process operative to form spacers adjacent to the first gate stack.

8. The method of claim 1, wherein the forming a hardmask layer over the first source region, the first drain region, the first gate stack and a portion of the first diode layer includes:
    depositing a layer of hardmask material over the exposed portions of the isolation regions, the first FET region, the second FET region, the diode region, the first gate stack and the second gate stack;
    forming a lithographic masking material over the layer of hardmask material in the second FET region, the second gate stack, and a portion of the first diode layer;
    etching to remove exposed portions of the layer of spacer material; and
    removing the lithographic masking material.

9. The method of claim 1, wherein the method further includes:
    removing portions of the hardmask layer;
    forming a capping layer over the exposed portions of the first source region, the first drain region, the first gate stack, the first diode layer, portions of the second diode layer, the second source region, the second drain region, and the second gate stack;
    removing portions of the capping layer to form cavities that expose portions of the first source region, the first drain region, the first gate stack the first diode layer the second diode layer, the second source region, the second drain region, and the second gate stack; and
    filling the cavities with a conductive material.

10. The method of claim 1, wherein the forming the first diode layer in the diode region using the first epitaxial growth process includes forming a doped region in the first diode layer and forming an undoped region disposed on the doped region of the first diode layer.

11. A semiconductor device manufactured by the process of claim 1.

12. A method, comprising:
    forming isolation regions in a semiconductor substrate to define a first field effect transistor (FET) region and a diode region;
    forming a first gate stack in the first FET region;
    forming a first source region and a first drain region in the first FET region and a first diode layer in the diode region using a first epitaxial growth process;
    forming a hardmask layer over the first source region, the first drain region, the first gate stack and a portion of the first diode layer; and
    forming a second diode layer on the first diode layer using a second epitaxial growth process.

13. The method of claim 12, wherein the first epitaxial growth process includes epitaxially growing a silicon material with p-type dopants such that the first source region, the first drain region, and portions of the first diode layer include p-type dopants and the second epitaxial growth process includes epitaxially growing a silicon material with n-type dopants such that the second diode layer include n-type dopants.

14. The method of claim 12, wherein the first epitaxial growth process includes epitaxially growing a silicon material with n-type dopants such that the first source region, the first drain region, and portions of the first diode layer include n-type dopants and the second epitaxial growth process includes epitaxially growing a silicon material with p-type dopants such that the second diode layer include p-type dopants.

* * * * *